United States Patent [19]
Sadigh-Behzadi

[11] Patent Number: 4,705,332
[45] Date of Patent: Nov. 10, 1987

[54] HIGH DENSITY, CONTROLLED IMPEDANCE CONNECTORS

[75] Inventor: Amir-Akbar Sadigh-Behzadi, Van Nuys, Calif.

[73] Assignee: Criton Technologies, Chatsworth, Calif.

[21] Appl. No.: 16,968

[22] Filed: Feb. 25, 1987

Related U.S. Application Data

[63] Continuation of Ser. No. 762,706, Aug. 5, 1985, abandoned.

[51] Int. Cl.⁴ ........ H05K 1/00
[52] U.S. Cl. ........ 439/69; 439/292; 439/717
[58] Field of Search ........ 339/17 R, 17 C, 17 LC, 339/17 LM, 17 M, 47–49, 198, 208, 210, 196, 14 R, 14 P, 143 R; 361/393, 407, 408

[56] References Cited

U.S. PATENT DOCUMENTS

| | | | |
|---|---|---|---|
| 3,184,649 | 5/1965 | Singletary | 361/393 |
| 3,209,208 | 9/1965 | Francis et al. | 361/393 |
| 3,215,968 | 11/1965 | Hermann | 339/17 LM |
| 3,270,311 | 8/1966 | Deer et al. | 339/17 M |
| 3,401,369 | 9/1968 | Palmateer et al. | 339/17 |
| 3,430,182 | 2/1969 | Blanche | 339/17 |
| 3,493,313 | 4/1969 | Fischer et al. | 339/208 |
| 3,495,134 | 2/1970 | Collins et al. | 317/101 |
| 3,601,753 | 8/1971 | Uberbacher | 339/18 C |
| 3,601,772 | 8/1971 | Mancini | 339/17 LC |
| 3,605,068 | 9/1971 | Rayburn | 339/49 R |
| 3,612,274 | 10/1971 | Thomas | 174/36 |
| 3,651,432 | 3/1972 | Henschen et al. | 333/33 |
| 3,705,332 | 12/1972 | Parks | 317/101 CM |
| 3,780,238 | 12/1973 | Brant et al. | 361/393 |
| 4,070,084 | 1/1978 | Hutchison | 339/143 R |
| 4,232,929 | 11/1980 | Zobawa | 339/143 R |
| 4,441,088 | 4/1984 | Anderson | 174/36 |
| 4,533,203 | 8/1985 | Feldman et al. | 339/17 LM |
| 4,577,922 | 3/1986 | Stipanuk et al. | 339/17 C |

FOREIGN PATENT DOCUMENTS 1410779 10/1975 United Kingdom ........ 339/17 M

OTHER PUBLICATIONS

IBM Tech. Disclosure Bulletin, L. H. Faure et al, vol. 17, No. 2, Jul. 1974, pp. 444–445.
Shielded in-Line Electrical Multiconnector, J. Straus, IBM Technical Disclosure Bulletin, vol. 10, No. 3, 8/67, p. 203, "Testing Electrical and Transmission Properties in Flat Cable", D. Bossi, 12/70.

*Primary Examiner*—Gil Weidenfeld
*Assistant Examiner*—David Pirlot
*Attorney, Agent, or Firm*—Poms, Smith, Lande & Rose

[57] ABSTRACT

A high density electrical connector is shown in which discrete dielectric wafers mount several contact elements within grooves on a first surface of the wafer while mounting a single ground plane within a recess on a second surface. This configuration, when the wafers are stacked side-by-side, forms the contacts in a stripline connection in which the impedance of each contact may be controlled. The wafers may be inserted into slots within a housing to form a high density connector for joining a daughter board to a mother board.

31 Claims, 22 Drawing Figures

HIGH DENSITY, CONTROLLED IMPEDANCE CONNECTORS

This application is a continuation of application Ser. No. 762,706 filed 8-5-85, now abandoned.

BACKGROUND OF THE INVENTION

I. Field of the Invention

The present invention relates to a high density, controlled impedance connector and, more particularly, to a high density connector which may be utilized to mate a plurality of modules (daughter boards) to a backplane (mother board) wherein each electrical connection has a controlled impedance and a minimum amount of crosstalk.

II. Description of the Prior Art

In the prior art, there has been a considerable amount of discussion of the utilization of a flat cable system which migh include a flat or round wire for handling high speed signals such as high speed digital pulses. The advantage of the flat cable is that one or two sides of the cable may be provided with a conductive layer which, in turn, is connected to ground. If a single conductive layer is used on one side, a microstrip is formed. When conductive layers are used on both sides, a stripline is formed. For an article discussing the mathematics and properties of such flat cables, see: Bossi, Dennis F., *Testing Electrical And Transmission Properties In Flat Cable,* presented at the 19th International Wire & Cable Symposium, Atlantic City, N.J., December, 1970.

A flat cable formed with a plurality of flat conductors and surrounded on its upper and lower surface by a ground plane, thus forming a stripline, may be found in U.S. Pat. No. 3,612,744, issued Oct. 12, 1971 and invented by P. J. Thomas. A second flat cable in the form of a microstrip is described in U.S. Pat. No. 4,441,088, which issued Apr. 3, 1984 by C. J. Anderson. The Anderson patent discusses the reduction of crosstalk by adjusting the amount of dielectric material between the flat conductor and the ground plane in proportion to the amount of dielectric material placed over the flat conductor.

The advantage of utilizing a flat cable becomes apparent after consideration of the discussions within the references cited above. That is, the dimensions of the cable may be altered to select or control the impedance and to reduce the amount of crosstalk. This concept was incorporated into an early connector wherein a dielectric sheet of resilient material was surrounded on one side by a ground plane and on the other by conductive strips. The distance between the conductive strips and the resilient ground plane was said to achieve impedance matching characteristics. See U.S. Pat. No. 3,401,369, issued Sept. 10, 1968 by P. H. Palmateer, et al.

A later connector for shielding electrical contacts therein to permit a high frequency signal to pass there through utilizing a stripline configuration is shown in an IBM Technical Disclosure Bulletin, Volume 10, No. 3, August 1967, pp. 203-4. This connector does not contemplate a high density connector as in the present invention.

It is also known in the prior art to use a connector having a plurality of contacts mounted directly into a mother board. These contacts mate with conductive elements upon the mother board and include spring fingers that wipe conductive elements on a daughter board to make electrical connection between the daughter board and the mother board. In one such connector, shown in U.S. Pat. No. 3,651,432, issued Mar. 21, 1972, by H. E. Henschen, et al., impedance matching of a microstrip circuit is accomplished by connecting a middle contact to a signal carrying element on the mother board while connecting contacts on either side thereof to a ground plane on the opposite side of the mother board. In this configuration, the signal carrying contact is surrounded by a ground connection to control and match impedance. However, this configuration is extremely bulky and does not lend itself to a high density connector system.

Two additional connector systems utilizing round wires which are bent at ninety degrees to form contacts that are inserted into a mother board are shown in U.S. Pat. No. 4,070,084, issued Jan. 24, 1978, by R. V. Hutchison, and U.S. Pat. No. 4,232,929, issued Nov. 11, 1980, by F. Zobawa. The first patent discusses a means for controlling impedance using a microstrip arrangement by imbedding a conductive element within a dielectric substrate. An alternative arrangement shows a flexible dielectric material with a ground plane on one side and conductive elements on the other. The second patent discusses reduction of crosstalk by an intermediate ground plane located between the contacts. Each of these arrangements suffer from bulk and inability to produce a high density connector.

SUMMARY OF THE INVENTION

Accordingly, it is an object of the present invention to provide a high density connector which is capable of producing a constant impedance and a reduced crosstalk.

It is another object of the present invention to provide a high density connector which permits the control of impedance regardless of the length of the contact through the utilization of a stripline configuration within the connector.

A further object is to provide a high density connector which may be easily configured to accommodate different sized printed circuit boards and different mounting configurations.

Yet a further object is to provide a configuration for an electrical connector which may be easily replaced and repaired.

A still further object of this invention is to provide a high density, controlled impedance connector, which is economic, flexible and expandable.

In accomplishing these and other objects, there is provided a discrete wafer formed from a dielectric material having a plurality of conductive elements mounted by said wafer. A single, ground plane element for connection to an electrical ground is also mounted by the wafer. The discrete wafers are then stacked side-by-side in an arrangement which permits the ground plane, mounted by two wafers, to surround the plurality of conductive elements, mounted by a single discrete wafer. This arrangement creates a stripline configuration for the plurality of conductive elements, whose configuration controls the impedance of the conductive elements.

BRIEF DESCRIPTION OF THE DRAWINGS

There are several embodiments which incorporate the unique ideas of the present invention. These embodiments will be better understood after consideration of the following specification and drawings wherein.

DESCRIPTION OF THE PREFERRED AND ALTERNATIVE EMBODIMENTS

Figure 1:
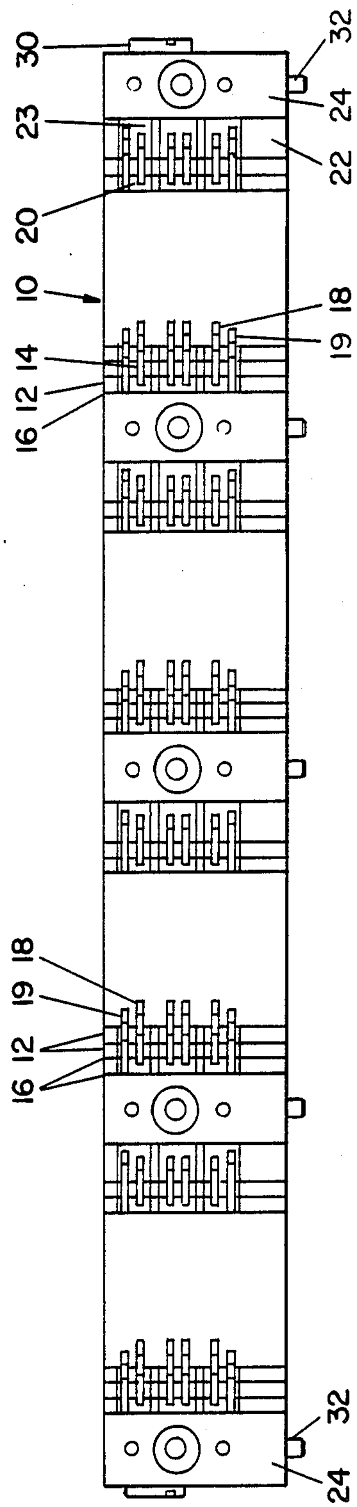
FIG. 1 is a side view showing an alternative embodiment of a high density connector incorporating the present invention.
Figure 3:
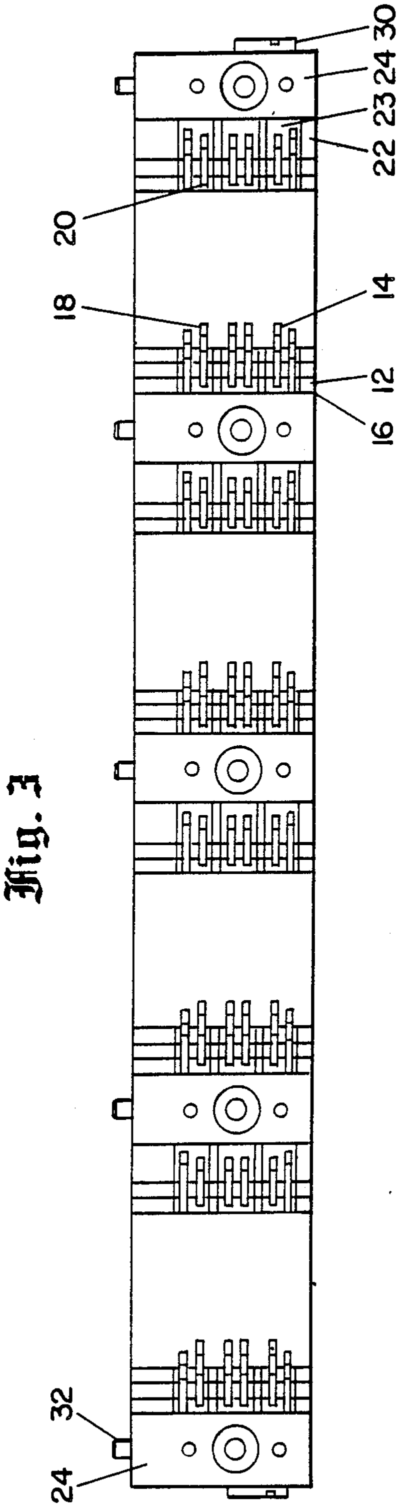
FIG. 3 is a bottom plane view of FIG. 1.
Figure 4:
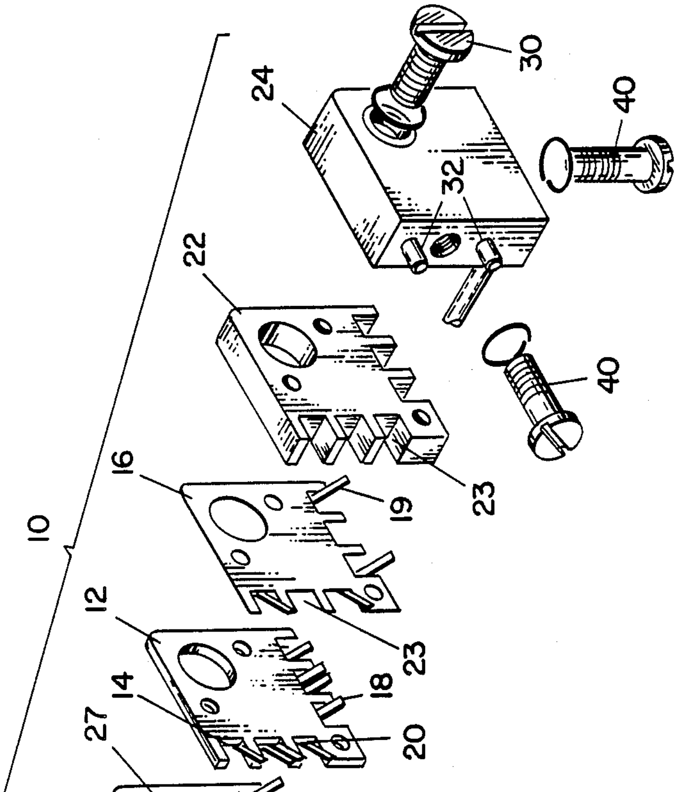
FIG. 4 is an exploded, perspective view, showing the connector illustrated in FIGS. 1–3.
Figure 4:
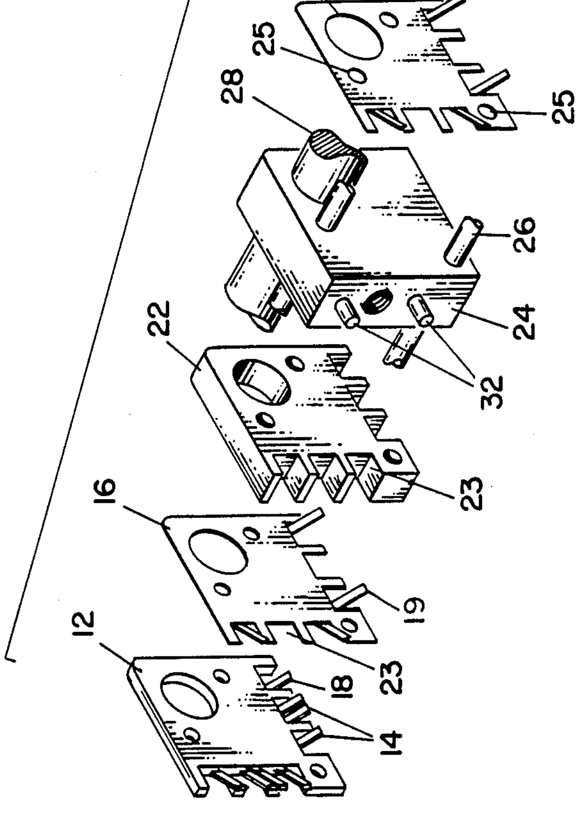
Figure 2:
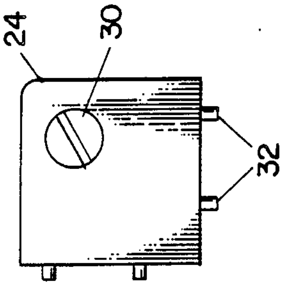
FIG. 2 is an end view of FIG. 1.

Referring now to the drawings, FIGS. 1–5 illustrate one embodiment of the high density connector 10 wherein FIG. 1 is a side view showing various components of the connector including a discrete wafer 12 which, in this alternative embodiment, mounts a plurality of signal carrying contact elements 14 adjacent to which is mounted a single ground plane element 16. Each discrete wafer 12 is placed in a side-by-side stack with other discrete wafers 12 having ground plane elements 16 placed therebetween as best seen in FIG. 4. In this configuration, the individual contact elements 12 are encapsulated within the insulating, dielectric material of wafer 14 and surrounded on each side by ground planes 16 for creating a stripline arrangement for each contact element 14.

In the embodiments shown in FIGS. 1–5, it will be seen that the individual contact elements 14 are fabricated to form a ninety degree turn (FIG. 5) which is terminated at each end by a pair of spring wiping finger 18. Similarly, the ground plane elements 16 are each provided with four spring wiping fingers 19 (FIG. 4). The spring fingers 18 and 19 are bent at an angle to the right in FIGS. 1, 2 and 4 with fingers 18 extending from each wafer 12 at a surface which has been recessed at 20 to permit flexure in the right-hand direction. As seen in FIGS. 1 and 3, the right-hand flexure of the spring fingers 18 and 19 fits over adjacent spring fingers so that a high density of these fingers may be accommodated within the side-by-side stack of wafers 12. A spacer 22 is provided at the far right edge of each stack, followed by a mounting bracket 24. The ground plane element 16 and spacers 22 have a configuration similar to the configuration of wafer 12 which includes a recess 23. It may now be seen that the purpose of the spacer 22 and its recess 23 is to provide an area into which the spring fingers 18 and 19 may flex when the connector 10 is assembled against a printed circuit board. The addition of the mounting brackets 24 on opposite sides of the wafer stack completes the assembly.

As best seen in FIG. 4, the wafers 12, ground plane elements 16, spacers 22 and mounting brackets 24 are assembled in a stack which may be formed by a series of repeated parts to any desired length. These parts are provided with a plurality of apertures including three smaller apertures 25 for receiving a set of locating shafts 26 and a larger aperture 27 for receiving a support shaft 28. The connector 10 is thus assembled by stacking a mounting bracket 24 on the left-hand end of the stack followed by a ground plane element 16, a wafer 12, and a ground plane element 16 until a predetermined number of wafers and ground plane elements have been stacked upon the shafts 26 and 28. It should be noted here that the number of ground plane elements 16 is one more than the wafers 12. The stack is then followed by a spacer 22 which provides the recesses 23 into which the spring fingers 18 for contacts 14 and spring fingers 19 for ground plane 16 extend. The next element in the stack is a second mounting bracket 24. In the embodiment shown in FIGS. 1–3, the stack is typically $12'' \times \frac{1}{2} \times \frac{1}{2}''$ in size. The support shaft 28 receives a screw 30 at each end whose threads pass through a clearance hole in bracket 24 into the internally threaded end of shaft 28 for compressing and retaining the 12" stack in its desired configuration. In the high density connector 10 shown in FIGS. 1–5, there are four contact elements 14 with corresponding spring fingers 18 mounted between the two spring fingers 19 associated with the ground plane element 16. This assures good electrical isolation for the four contacts 14.

Figure 5:
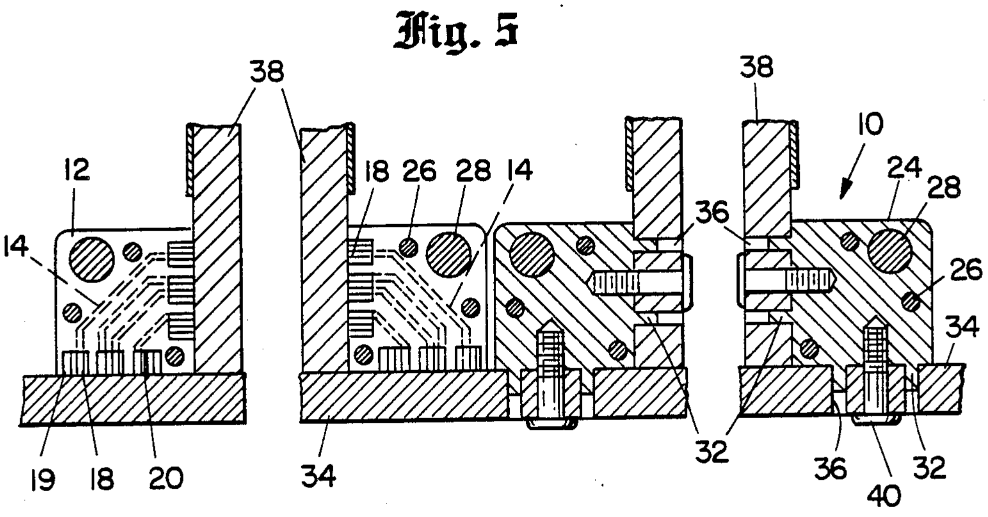
FIG. 5 is a cross sectional view showing the high density connector mounting four daughter boards upon a mother board.

Referring now to FIG. 5, the connector 10 is shown with each bracket 24 having four locating pins 32 extending from two adjacent surfaces. A first surface mounts a backplane or mother board 34 wherein locating pins 32 are received by apertures 36 within the board 34. Mounted at a right angle, or ninety degrees to the mother board 34 is a module or daughter board 38, also having apertures 36 therein for receiving the locating pins 32. The mother and daughter boards 34 and 38 are retained against the connector 10 by suitable fastening means, such as screws 40. As seen in the right-hand portion of FIG. 5, the screws 40 pass through the boards 34 and 38 into threaded holes in the mounting brackets 24. Further down the stack of connector 10, as seen in the left-hand portion of FIG. 5, the wafers 12 are illustrated with the contact elements 14 encapsulated therein. It will be understood that the spring fingers 18 of contact elements 14 are compressed against the mother and daughter boards 34 and 38 within the recesses 20 to make an electrical connection therebetween.

Figure 6:
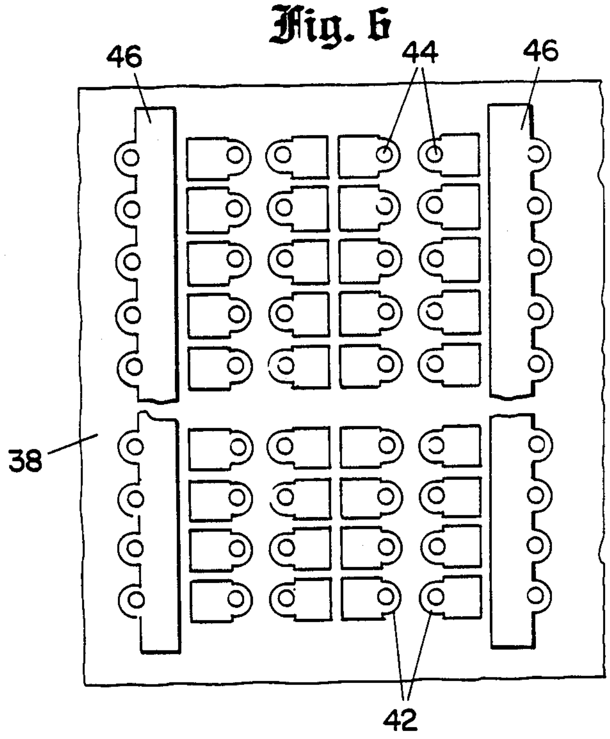
FIG. 6 shows a typical layout for the conductive pads which may be utilized upon a mother board or a daughter board, mounting the connectors shown in FIGS. 1–5.

To accomplish the electrical connection, the spring fingers 18 contact suitable pads 42 such as those shown in FIG. 6 mounted upon the daughter board 38. Each individual pad 42 is provided with apertures 44 to make an electrical connection to the far side of the daughter board where connection with electrical conductors (not shown) is completed. The spring fingers 19 on the ground plane elements 16 contact a pair of conductive strips 46 on either side of the pads 42.

In the alternative embodiment shown in FIGS. 1–5, the connector 10 consists of a stack of five brackets 24, four spacers 22, two hundred and four wafers 12 and two hundred and eight ground planes 14. The reader will remember that, in the embodiment shown, there are four substacks of wafers 12 so that the one additional ground plane 16 in each substack totals the four additional ground planes in the completed stack. The arrangement shown provides for eight hundred and sixteen signal contacts made by spring fingers 18 and four hundred and sixteen ground contacts made by fingers 19.

Figure 7:
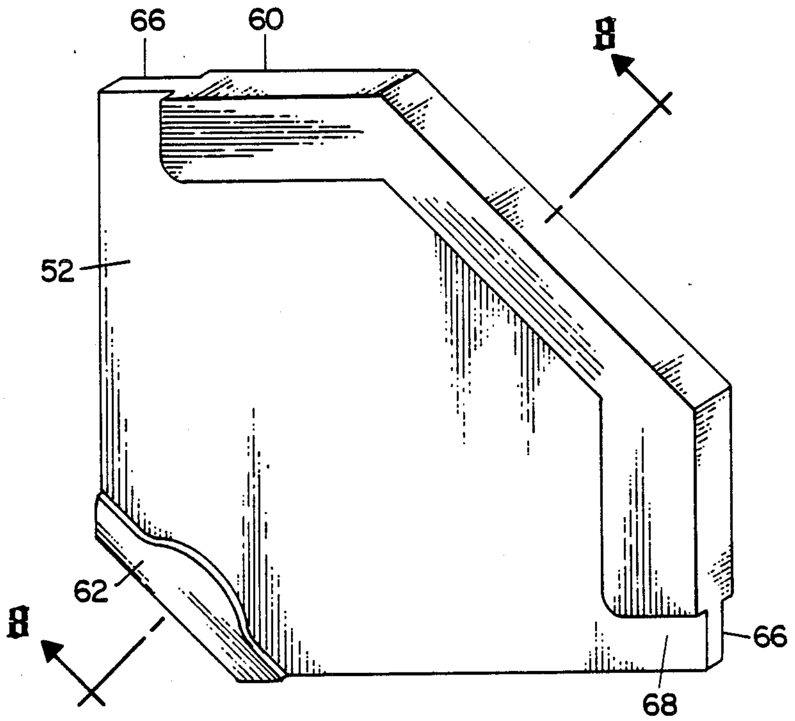
FIG. 7 is a perspective view showing an insulated discrete wafer utilized within a preferred embodiment of the present invention.
Figure 8:
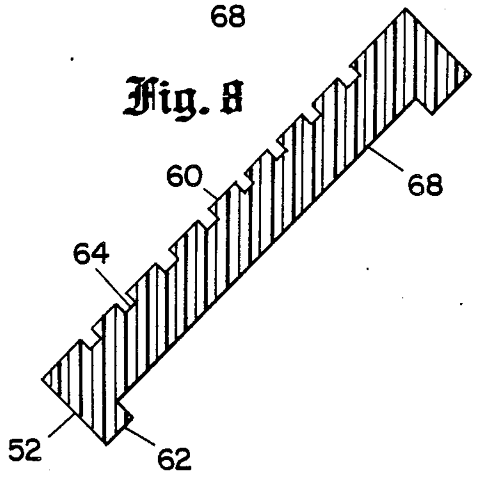
FIG. 8 is a cross-sectional view taken along line 8—8 of FIG. 7.

A preferred embodiment of the present invention is shown in FIGS. 7–14. As best seen in FIGS. 7 and 8, a discrete dielectric wafer 52 is molded from suitable insulation materials, such as polysulfone, to mount a plurality of individual conductive contact elements 54, FIG. 9, on one side, and to mount a single ground plane element 56 on the other side thereof, FIG. 10. Each individual signal contact 54 is constructed with an arcuate curve of ninety degrees which is terminated at each end by a spring wiping fingers 58. The spring fingers 58 are shown in their compressed position in FIGS. 9 and 10 as if pressed against a printed circuit board such as boards 34 or 38. The ground plane element 56 is also provided with a plurality of spring fingers 59, which coincide in their spacing with each individual spring finger 58 from the contact elements 54. In the preferred embodiment, the contact elements 54 and ground plane elements 56 may be constructed from beryllum copper or other suitable alloys.

The dielectric wafer 52 is molded into a hexagonal shape having first and second generally flat surfaces 60 and 62 (FIG. 7). The first surface 60 is provided with a plurality of grooves 64, eight are shown in the preferred embodiment of FIG. 8, which receive the arcuate contact elements 54. Two edges of surface 60, arranged at right angles to one another, are relieved to a depth equal to the depth of grooves 64 to form recesses 66. These recesses 66 provide clearance for the motion of the spring fingers 58 as they are pressed against the printed circuit boards. The second surface 62 of wafer 52 is provided with a single recess 68 which receives the ground plane element 56. Recess 68 extends to the two edges of the hexagonal wafer 52 that are arranged at ninety degrees to one another to permit the spring fingers 59 of the ground plane element 56 to be exposed to the printed circuit boards opposite fingers 58.

Figure 9:
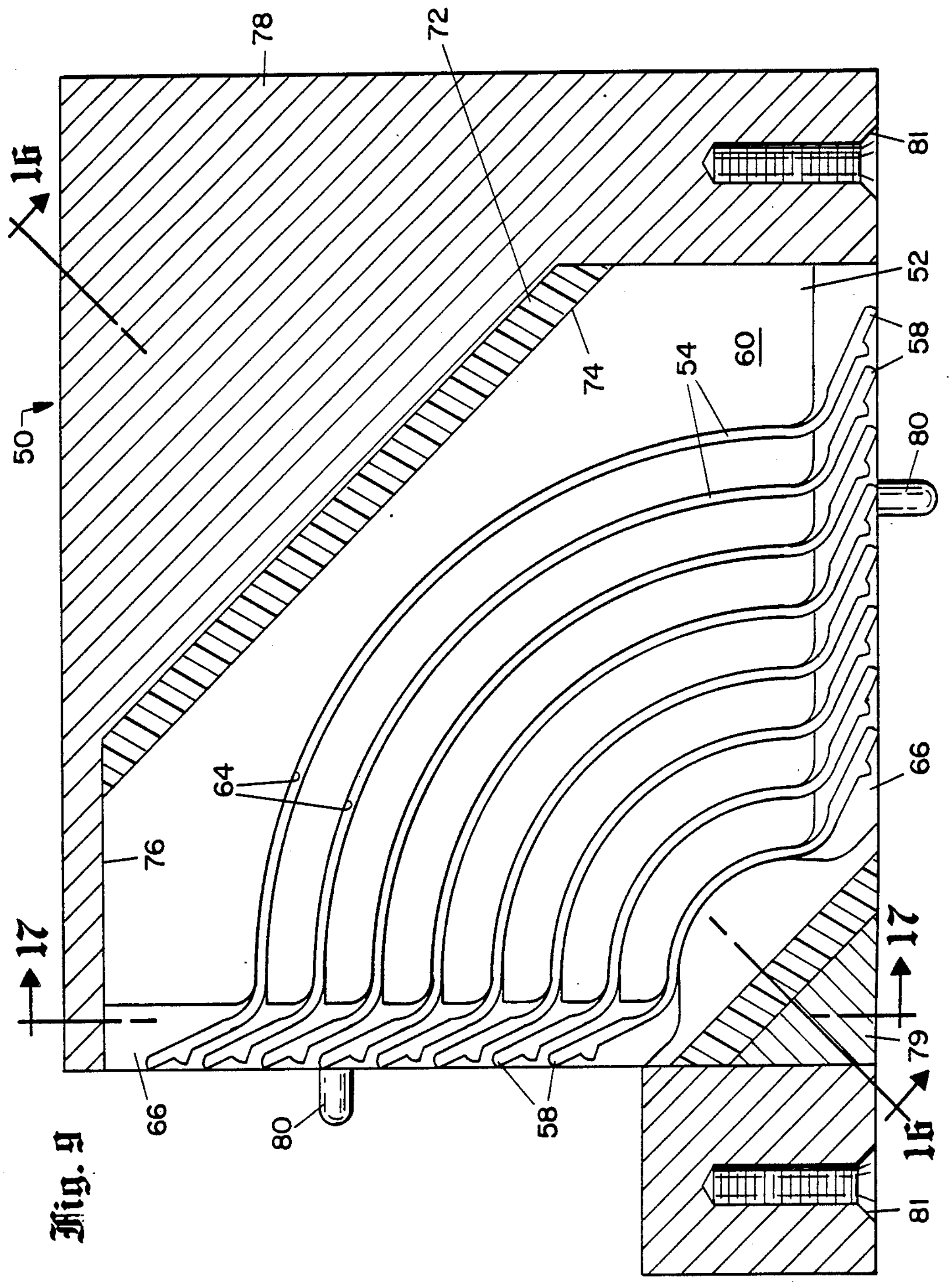
FIG. 9 is a cross-sectional view of a high density connector incorporating the wafer shown in FIGS. 7 and 8.
Figure 10:
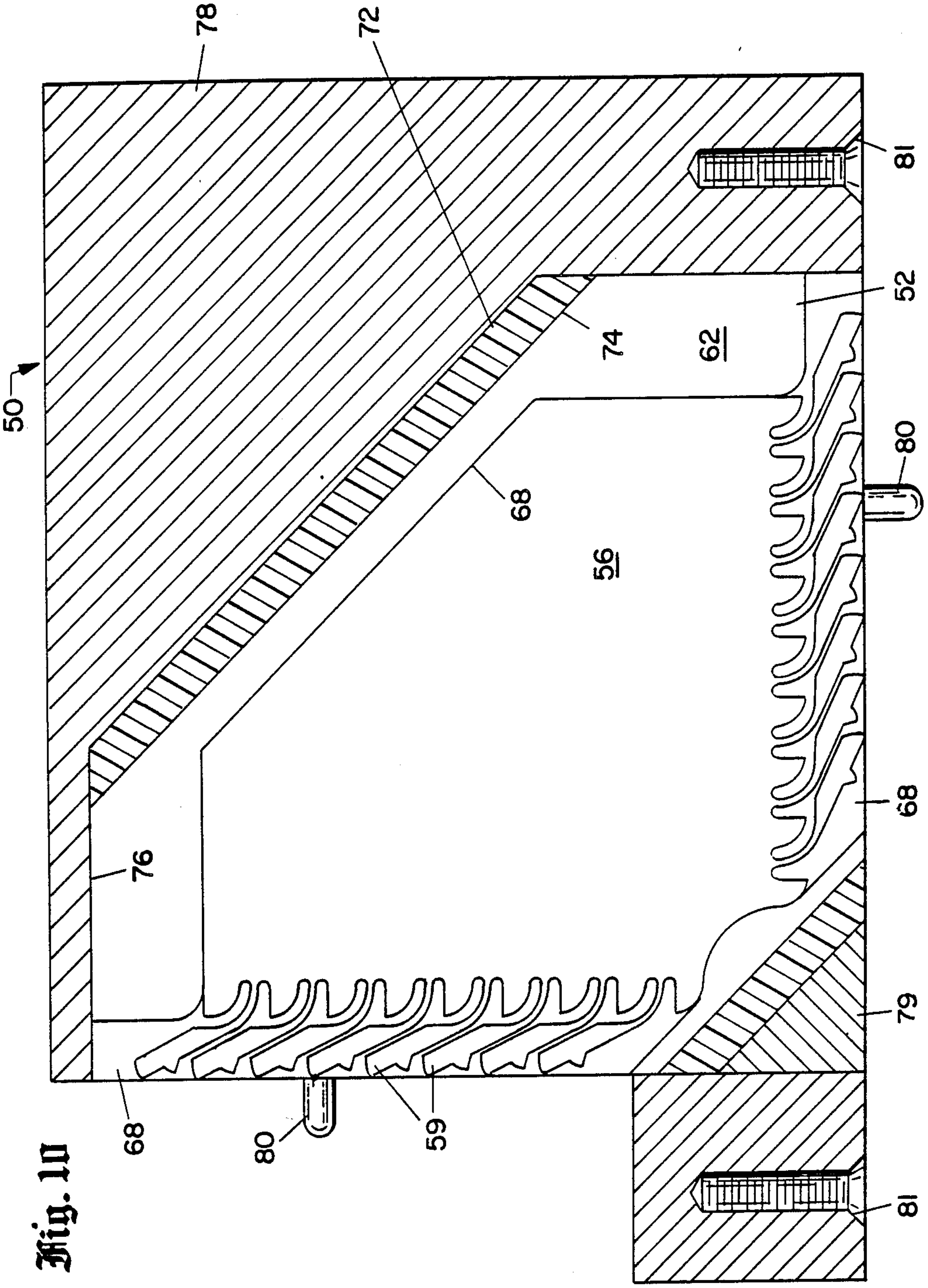
FIG. 10 is a cross-sectional view of the second side of the wafer shown in FIG. 9.

It will be seen from a comparison of the contacts 58 in FIG. 9 with the contacts 59 in FIG. 10 that the ground plane contacts 59 are wider than their counterparts 58. This configuration assures that the narrower spring fingers 58 of the signal carrying contacts 54 are better shielded by the individual spring fingers 59 to reduce crosstalk between fingers 58.

Figure 11:
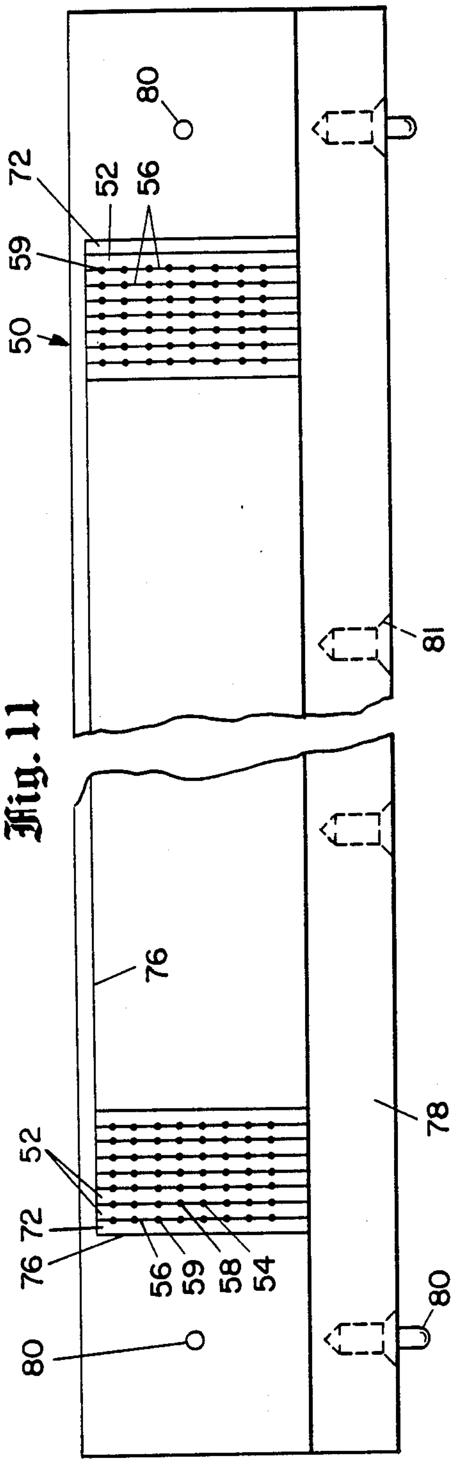
FIG. 11 is a side view, similar to FIG. 1, illustrating the preferred embodiment of a high density connector incorporating the features of the present invention.
Figure 13:
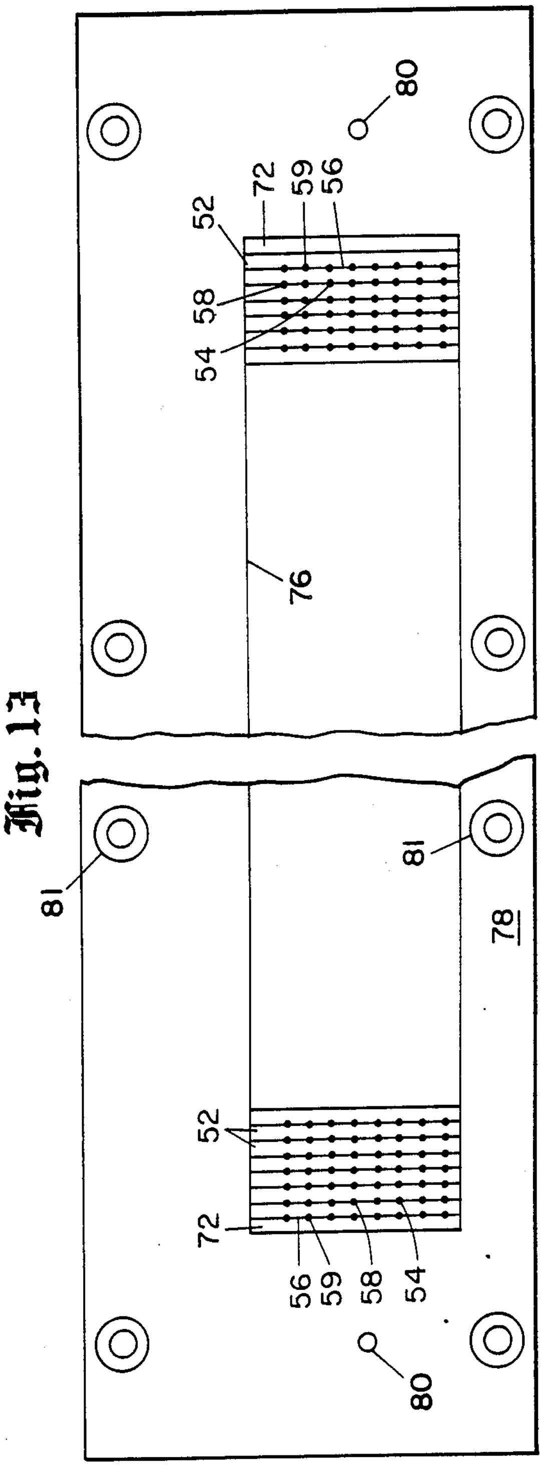
FIG. 13 is a bottom plan view of the connector shown in FIG. 11.
Figure 12:
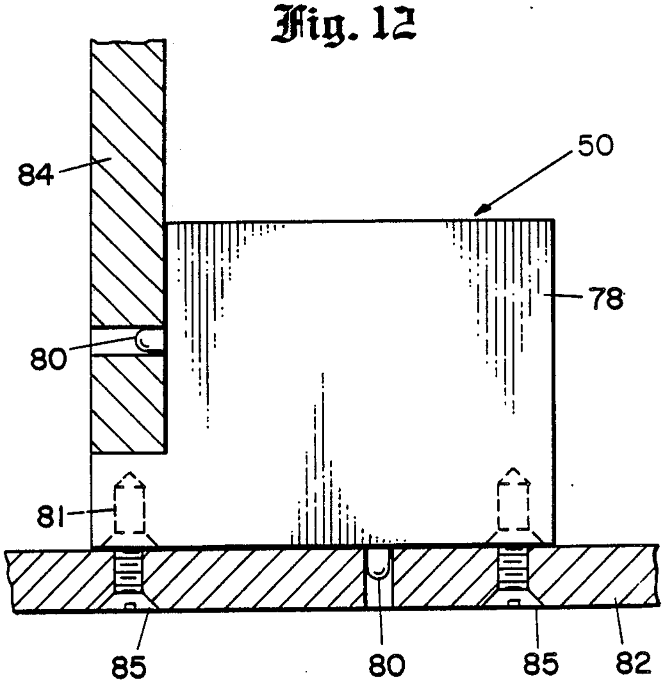
FIG. 12 is an end view of FIG. 11.
Figure 14:
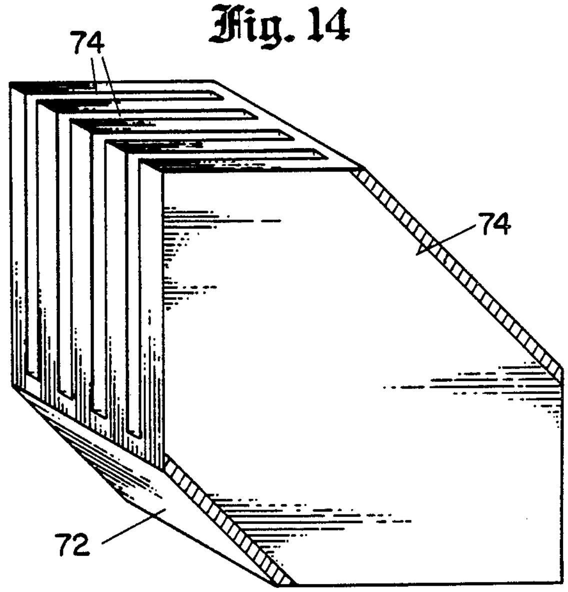
FIG. 14 is a perspective view showing an insulating housing which receives the discrete wafers of FIG. 7.

Referring now to FIGS. 11–13, it will be seen that the discrete wafers 52 with the contacts 54 and ground plane 56 in place may be stacked in a side-by-side arrangement to create a stack that forms the high density connector 50. It is possible to form the grooves 64 deep enough within the surfaces 60 of wafers 52 to place one wafer against the other without causing the contact elements 54 to touch the adjacent ground plane 56. However, in the preferred embodiment, a slotted housing 72 is provided to receive that discrete wafers 52. Housing 72, FIG. 14, has a hexagonal cross section and is molded from a suitable insulated material, such as polysulfone, with a plurality of slots 74 which are open along two edge surfaces arranged at a right angle to one another. The slots 74 are arranged to receive the wafers 52, contact elements 54, and ground planes 56. The housing 72 thus forms a first housing for mounting the plurality of wafers 52. Housing 72 is then inserted into an elongated opening 76 in the second housing 78. The insertion of first housing 72 into elongated openings 76 may be accomplished by removing the top of housing 78. However, in the preferred embodiment, a pie shaped piece 79 is removed. Housing 72 is then rotated slightly and inserted into opening 76 so as not to injure the spring fingers 58 and 59. By rotating the housing 72, it is possible to insert the housing 72 into slot 76 far enough to permit the clearance of contacts 58 and 59 into the left-hand opening of slot 76. Once housing 72 is firmly in place in housing slot 76, the wedge member 79 may be replaced and retained by suitable fastening means, such as screws, not shown. The second housing 78 is provided with locating pins 80 and threaded apertures 81 for aligning and mounting the connector 50 to suitable printed circuit boards 82 and 84, or by screws 85, FIG. 12.

It will be seen in FIGS. 11 and 13 that the stack of wafers 52 comprises a ground plane 56 at the far left-hand end of the slot 76 adjacent housing 72. The ground plane is mounted by the wafer 52 whose next surface mounts the contact elements 54. This alternate stack continues until the far right-hand end of slot 76 wherein the last wafer 52 includes only the ground plane 56. Thus, slot 76 may mount one hundred and one wafers 52 therein having one hundred sets of contact elements 54 and one hundred and one sets of ground plane elements 56. This configuration mounts a total of sixteen hundred and eight spring finger contacts 54 and 56. The reader will understand that the spring fingers 54 and 56 are shown schematically in FIGS. 11 and 13 as simple dots.

Figure 15:
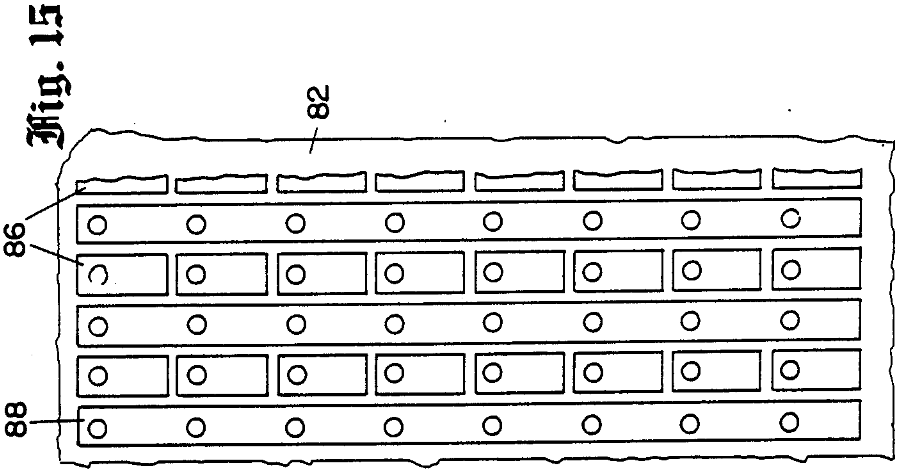
FIG. 15 is a partial view showing the conductive pads, which may be utilized upon a printed circuit board mounting the connector shown in FIGS. 7–14.

Once a printed circuit board or mother board 82 is pressed against the housing 78 of connector 50, the spring fingers 58 of contact elements 54 slide across pads 86 (FIG. 15) to make electrical contact with the board 82. Similarly, the spring fingers 59 of the ground plane elements 56 slide across conductive strips 88 to complete the stripline circuit formed by surrounding contact elements 54 by ground planes 56.

Figure 16:
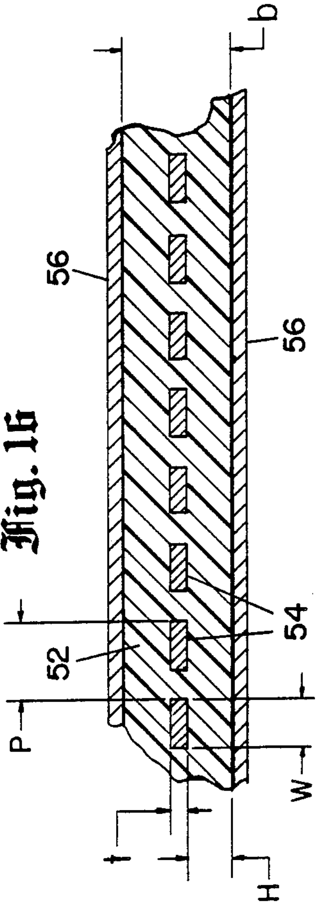
FIG. 16 is a cross-sectional view taken along line 16—16 of FIG. 9.

As seen in FIG. 16, the cross section of the stripline connection formed by ground plane elements 56 on either side of contact elements 54 has been formed with the side-by-side ground planes 56 equal distance from the contacts 54. The ground planes 56 are separated by a distance "b" whereas the contact elements 54 having a width "w" and a thickness "t" are spaced from the bottom ground plane 56 by a distance "H". Lastly, the contacts 54 are spaced apart by a pitch "P". The impedance $Z_o$ of each contact 54 may be expressed by the equation:

$$Z_o = \frac{60}{\sqrt{e_r}} l_n \left( \frac{4b}{.67\pi\,(.8\,w + t)} \right)$$

wherein:

b=height t=thickness of conductor;

w=width of conductor $e_r$=relative dielectric constant of insulation materials; and ln=natural log.

From the foregoing equation, one notes there are four values which may be adjusted to adjust and control the impedance of the connector. These include the dielectric constant of the insulating material which forms wafer 52, the width and thickness of contact 54, and the height between the ground plane 56 and contact 54. By adjusting one or all of these values, one may establish the impedance of each contact element 54 at a constant value, for example: 60 ohms, regardless of the length of that contact element.

Figure 17:
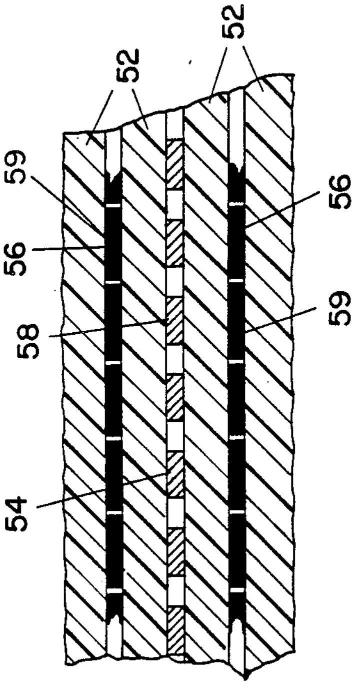
FIG. 17 is a cross-sectional view taken along line 17—17 of FIG. 9.
Figure 18:
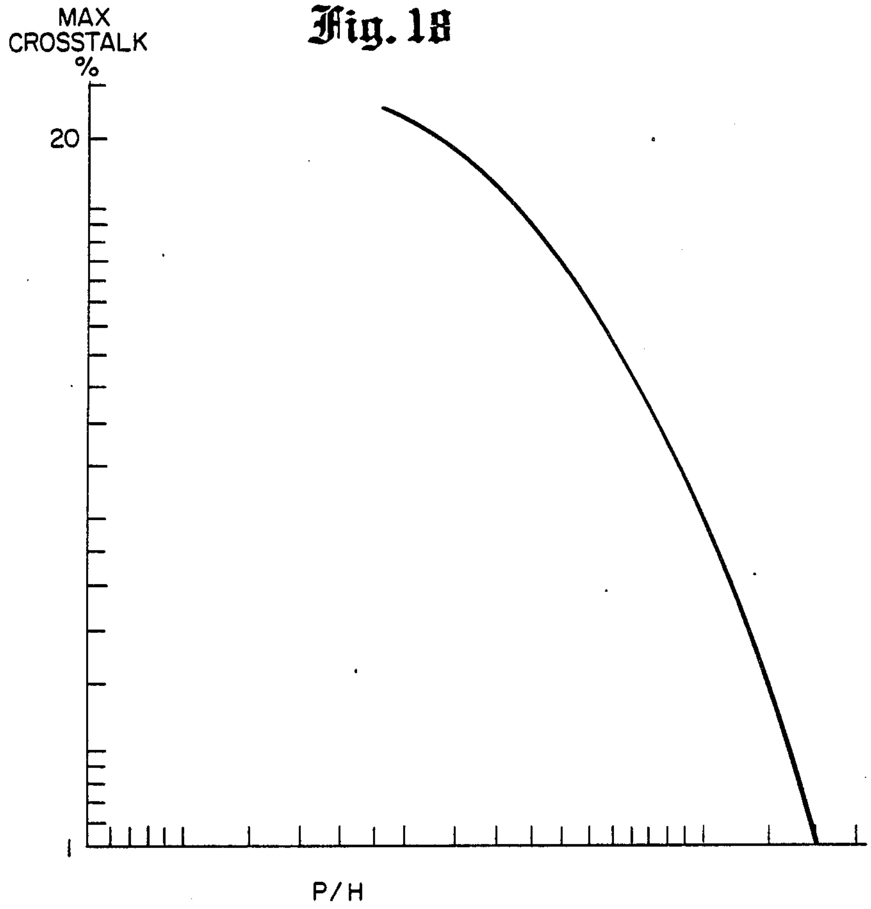
FIG. 18 is a curve showing the maximum crosstalk as a percentage versus the pitch to height ratio (P/H) of the connector.

Crosstalk within connector 50 may be reduced by providing a thicker spring finger 59 for each ground plane 56 than the related spring finger 58 for each contact 54. This configuration is shown in FIG. 17. Crosstalk may also be reduced by adjusting the ratio of the distance between two adjacent contact elements 54 or pitch "P" in proportion to the height "H" of the contacts 54 above the ground plane 56. The percentage of reduction of crosstalk versus the pitch to height ratio (P/H) is shown in FIG. 18. By adjusting the pitch of the contact elements 54 or the equal spacing of these contacts from the ground planes 56, it is possible to reduce crosstalk significantly as shown by the curve of FIG. 18.

Figure 19:
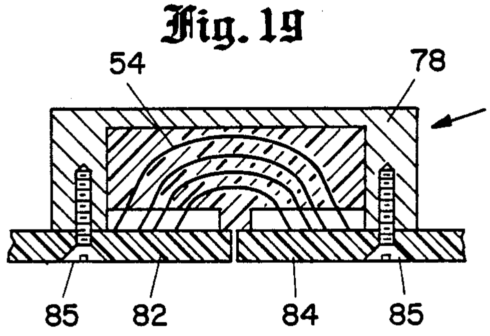
FIG. 19 is a schematic representation, similar to FIG. 12, showing a connector arrangement wherein the printed circuit boards may be mounted in a parallel and aligned configuration.
Figure 20:
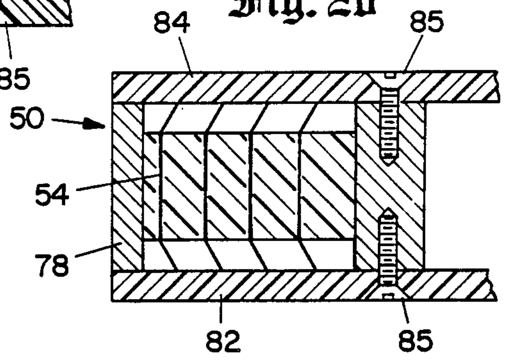
FIG. 20 is a schematic, similar to FIG. 19, presenting a connector mounting arrangement wherein the printed circuit boards may be mounted in parallel.
Figure 21:
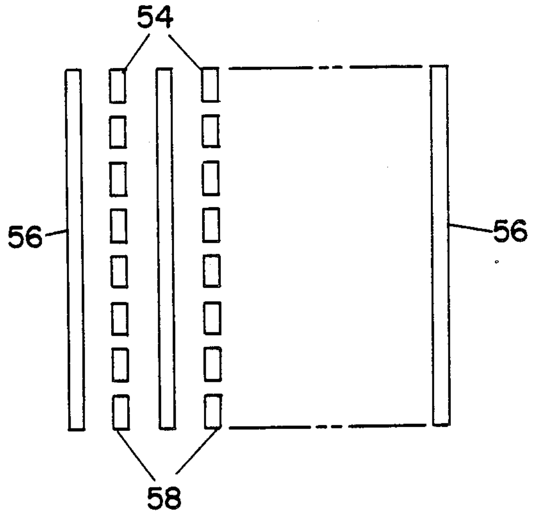
FIG. 21 shows a schematic arrangement of the plurality of conductive elements shown in the connector of FIGS. 7–14.
Figure 22:
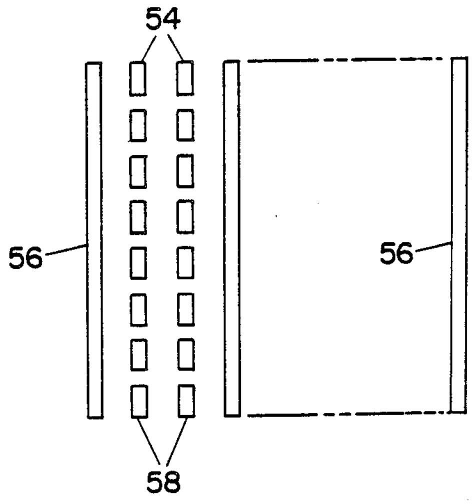
FIG. 22 is a schematic representation similar to FIG. 21 showing another embodiment.

While the preferred embodiment mounts the daughter board 84 at a right angle to the mother board 82 in FIG. 12, it will be understood that the connector 50 and its housing 78 may be modified wherein the contacts 54 extend through a 180 degree arc to mount the two boards 82 and 84 in a parallel in-line configuration, FIG. 19. Further, the connector 50 and its housing 78 may be modified to accommodate the contacts in a straight line configuration wherein the two boards 82 and 84 are mounted in a parallel configuration, one upon the other, FIG. 20. The preferred embodiments has also shown the spring fingers 58 from the contact elements 54 mounted in alternating rows with fingers 59 from the ground planes element 56. Such an arrangement is shown schematically in FIG. 21. There are other embodiments, however, where it may be desirable to place the spring fingers 58 in an immediate side-by-side relationship separated by a pair of ground plane elements 56. Such an arrangement is shown in FIG. 22. This arrangement may be easily accomplished by the present invention.

Other variations of the present invention will become apparent to those skilled in the art after reviewing the foregoing specification and attached drawings. Accordingly, the present invention should be limited only by the appended claims.

I claim:

1. A high density electrical connector with controlled impedance, comprising:

a plurality of discrete insulated wafers having generally flat sides;

a plurality of first conductive elements for carrying electrical signals protectively mounted by each wafer;

a single, second planar conductive element substantially covering said first elements and one of said wafer sides for connection to an electrical ground mounted only on one side of each wafer;

said plurality of discrete wafers mounted in a stack wherein each single, second, planar conductive element mounted only on one side of each wafer is mounted on each side of said plurality of first conductive elements to form stripline connections therewith in a high density stack wherein the impedance of each of said first conductive elements is controlled.

2. A high density electrical connector as claimed in claim 1, additionally comprising:

said wafers are dielectric; and said plurality of first conductive elements are mounted within each wafer.

3. A high density electrical connector, as claimed in claim 1, additionally comprising:

a first insulated housing having a plurality of slots therein, each slot receiving one of said wafers mounting said first and second conductive elements therein to form an elongated stack.

4. A high density electrical connector, as claimed in claim 1, additionally comprising:

shaft means passing through said wafers and said second conductive elements for retaining said wafers and first and second conductive elements in said stack.

5. A high density electrical connector, as claimed in claim 1, additionally comprising:

first and second printed circuit boards having conductive pads thereon;

said first and second conductive elements each having cantilevered spring means for engaging said conductive pads;

mounting bracket means;

spacer means;

said stack of wafers and first and second conductive elements including said mounting bracket means and spacer means.

6. A high density electrical connector, as claimed in claim 1, additionally comprising:

first and second printed circuit boards having conductive pads thereon;

said first and second conductive elements each having cantilevered spring means for engaging said conductive pads;

said spring means on said first conductive elements being narrower than said spring means on said second conductive elements to reduce crosstalk between said first elements.

7. A high density electrical connector, as claimed in claim 1, additionally comprising:

said wafers are dielectric, each having a first and second side;

said plurality of first conductive elements are mounted upon said first side of said wafers; and said single, second planar conductive element is mounted upon said second side of said wafers.

8. A high density electrical connector, as claimed in claim 7, additionally comprising:

said wafers having a plurality of grooves in said first side for mounting said first conductive elements therein; and said wafers having a recess in said second side for mounting said second, planar conductive element therein.

9. A high density electrical connector with controlled impedance, comprising:

a plurality of discrete insulated wafers;

a plurality of first conductive elements for carrying electrical signals protectively mounted by each wafer;

a single, second conductive element for connection to an electrical ground mounted by each wafer;

said plurality of discrete wafers mounted in a stack wherein each single, second conductive element mounted by each wafer is mounted on each side of said plurality of first conductive elements to form stripline connections in a high density stack;

a first insulated housing having a plurality of slots therein for receipt of said wafers and said first and second conductive elements within each slot to form an elongated stack;

a second housing having an elongated opening therein for receipt of said first insulated housing; and said second housing having means for mounting a first printed circuit board against a second printed circuit board.

10. A high density electrical connector, as claimed in claim 9, wherein:

said second housing mounts said first and second printed circuit boards at ninety degrees to each others.

11. A high density electrical connector, as claimed in claim 9 wherein:

said second housing mounts said first and second printed circuit boards in parallel to each other.

12. A high density electrical connector, as claimed in claim 9 wherein:

said second housing mounts said first and second printed circuit boards in parallel and in the same plane with each other.

13. A high density electrical connector with controlled impedance, comprising:

a plurality of discrete insulated wafers;

a plurality of first conductive elements for carrying electrical signals protectively mounted by each wafer;

a single, second conductive element for connection to an electrical ground mounted by each wafer;

mounting bracket means;

spacer means;

said plurality of discrete wafers mounted in a stack includes, in order, a mounting bracket means, a spacer means, a selected number of second conductive elements alternately stacked with a selected number of wafers having said first conductive elements mounted therein, there being one more second conductive element than said wafers in said stack, followed by a mounting bracket means;

shaft means for retaining said stack in said order;

first and second printed circuit boards having conductive pads thereon;

said first and second conductive elements each having spring means for engaging said conductive pads;

wherein each single, second conductive element mounted by each wafer is mounted on each side of said plurality of first conductive elements to form stripline connections in a high density stack between said conductive pads of said first and second printed circuit boards.

14. A high density electrical connector, as claimed in claim 13, wherein:

said mounting bracket means mount said first and second printed circuit boards at a desired angle to one another with said spring means in engagement with said conductive pads.

15. A high density electrical connector with controlled impedance, comprising:

a plurality of discrete insulated wafers each having a first and second side;

first conductive means for carrying electrical signals mounted on said first side;

second, planar conductive means substantially covering said first conductive means and said wafer for connection to an electrical ground mounted only on said second side;

said plurality of discrete wafers mounted in a side-by-side stack wherein said second conductive means mounted only on said second side are placed on each side of said first conductive means to form a high density stack of stripline connections for controlled impedance.

16. A high density electrical connector, as claimed in claim 15, additionally comprising;

said discrete insulated wafers including a dielectric material having grooves in said first side and a recess in said second side;

said first conductive means including a plurality of conductive contact elements mounted within said grooves; and said second, planar conductive means mounted within said recess.

17. A high density electrical connector, as claimed in claim 16, wherein:

said discrete wafers are arranged within said stack so that said stack includes alternately said first conductive means and said second conductive means.

18. A high density electrical connector, as claimed in claim 16, wherein:

said discrete wafers are arranged within said stack wherein said stack includes said second conductive means followed by two sets of said plurality of first conductive means followed by said second conductive means.

19. A high density electrical with controlled impedance, comprising:

a plurality of discrete insulated wafers each having a first and second side;

first conductive means for carrying electrical signals mounted on said first side;

second conductive means for connection to an electrical ground mounted on said second side;

said plurality of discrete wafers mounted in a side-by-side stack wherein said second conductive means are placed on each side of said first conductive means to form a high density stack of stripline connections for controlled impedance;

said discrete insulated wafers including a dielectric material having grooves in said first side and a recess in said second side;

said first conductive means including a plurality of contact elements mounted within said grooves;

said second conductive means including a single conductor plane mounted with said recess;

a first insulated housing having a plurality of parallel slots therein for mounting said discrete wafers and said first and second conductive means in an elongated stack;

a second housing having an elongated opening therein for receipt of first insulated housing; and said second housing having means for mounting a first printed circuit board against a second printed circuit board.

20. A high density electrical connector, as claimed in claim 19, wherein:

said second housing mounts said first and second printed circuit boards at ninety degrees to one another.

21. A high density electrical connector, as claimed in claim 19, wherein:

said second housing mounts said first and second printed circuit boards in parallel to one another.

22. A high density electrical connector, as claimed in claim 19, wherein:

said second housing mounts said first and second printed circuit boards in parallel and in the same plane with one another.

23. A high density electrical connector, as claimed in claim 15, additionally comprising;

first and second printed circuit boards, each having conductive pads thereon; and said first and second conductive means, each having cantilevered spring means for engaging said conductive pads.

24. A high density electrical connector, as claimed in claim 23, wherein:

said cantilevered spring means on said first conductive means have a relatively narrow width compared to the width of said cantilevered spring means on said second conductive means wherein said spring means on said second conductive means shield said spring means on said first conductive means for reducing crosstalk between said spring means on said first conductive means.

25. A high density electrical connector, as claimed in claim 16, additionally comprising;

a first insulated housing having a plurality of parallel slots therein, each slot mounting one of said discrete wafers and said first and second conductive means therein in an elongated stack.

26. A high density electrical connector, as claimed in claim 25, wherein:

said plurality of discrete wafers are stacked within said first insulated housing with the first wafer in said stack having said second conductive means facing the end of the stack and said plurality of discrete insulated wafers including a last wafer which mounts only said second conductive means whereby there is one more second conductive means within said stack than said first conductive means.

27. A high density electrical connector with controlled impedance, comprising:

a plurality of discrete insulated wafers, having a first side with grooves therein and a second side with a recess therein;

a plurality of first conductive means for carrying electrical signals mounted within said grooves in said first side of each wafer;

a single, second planar conductive means for connection to an electrical ground mounted only on one side of said wafer within said recess in said second side of each wafer;

an insulated housing having a plurality of parallel slots therein;

individual wafers including said first and second conductive means mounted within each parallel slot of said insulated housing in a side-by-side stack wherein said second conductive means mounted only on one side of said wafers are placed on each side of said first conductive means to form a high density stack of stripline connections for controlled impedance.

28. A high density electrical connector, as claimed in claim 27, additionally comprising:

first and second printed circuit boards, having conductive pads thereon;

said first and second conductive means each having cantilevered spring means for engaging said conductive pads;

said cantilevered spring means on said first conductive means being narrower than said cantilevered spring means on said second conductive means wherein said spring means on said second conductive means electrically isolate said spring means on said first conductive means for reducing crosstalk therebetween.

29. A high density electrical connector, as claimed in claim 28, additionally comprising:

means associated with said housing means for mounting said first and second printed circuit boards at a desired agle to one another.

30. A high density electrical connector, as claimed in claim 27, additionally comprising:

said second conductive means spaced from said first conductive means by a height determined by the insulated material of the discrete wafer;

said plurality of first conductive means having gaps therebetween that establish a relative pitch; and the ratio of the height between said first and second conductive means to the pitch between said plurality of first conductive means determining the amount of crosstalk between said first conductive means.

31. A high density electrical connector for connection between printed circuit boards with controlled impedance, comprising:

a plurality of discrete insulated wafers, having a first side with grooves therein and a second side with a recess therein;

a plurality of first conductive means for carrying electrical signals mounted within said grooves in said first side;

a plurality of second conductive means for connection to an electrical ground mounted within said recess in said second side;

an insulated housing having a plurality of parallel slots therein;

individual wafers including said first and second conductive means mounted within each parallel slot of said insulated housing in a side-by-side stack wherein said second conductive means are placed on each side of said first conductive means to form a high density stack of stripline connections for controlled impedance; and means for mounting printed circuit boards, including a second housing having an elongated opening therein for receiving said first mentioned housing.

* * * * *